US008304013B2

(12) United States Patent  (10) Patent No.: US 8,304,013 B2
Kalisch  (45) Date of Patent: Nov. 6, 2012

(54) METHODS FOR DEPOSITING ESPECIALLY DOPED LAYERS BY MEANS OF OVPD OR THE LIKE

(75) Inventor: Holger Kalisch, Kaarst (DE)

(73) Assignee: Aixtron Inc., Sunnyvale, CA (US)

( * ) Notice: Subject to any disclaimer, the term of this patent is extended or adjusted under 35 U.S.C. 154(b) by 738 days.

(21) Appl. No.: 12/163,546

(22) Filed: Jun. 27, 2008

(65) Prior Publication Data

US 2009/0004830 A1  Jan. 1, 2009

(30) Foreign Application Priority Data

Jun. 30, 2007 (DE) .......................... 10 2007 030 499

(51) Int. Cl.
 *B05D 5/12* (2006.01)
(52) U.S. Cl. ............. 427/64; 427/66; 427/74; 427/96.7; 427/96.8
(58) Field of Classification Search .................... 427/58, 427/64, 66, 74, 96.7, 96.8
 See application file for complete search history.

(56) References Cited

U.S. PATENT DOCUMENTS

| 5,156,815 | A | 10/1992 | Streetman |
| 5,554,220 | A | 9/1996 | Forrest et al. |
| 6,207,238 | B1 | 3/2001 | Affinito |
| 7,109,518 | B2* | 9/2006 | Sugawara ....................... 257/31 |
| 7,151,007 | B2 | 12/2006 | Werner |
| 7,201,942 | B2 | 4/2007 | Jurgensen et al. |
| 7,238,389 | B2* | 7/2007 | Long et al. ................. 427/248.1 |
| 7,851,016 | B2* | 12/2010 | Arbab et al. .................. 427/229 |
| 2003/0235648 | A1* | 12/2003 | Affinito et al. .................. 427/58 |
| 2004/0058167 | A1* | 3/2004 | Arbab et al. .................. 428/426 |
| 2004/0265253 | A1* | 12/2004 | Seo et al. ........................ 424/63 |
| 2005/0109281 | A1* | 5/2005 | Jurgensen et al. ............ 118/725 |

FOREIGN PATENT DOCUMENTS

| DE | 279032 A1 | 5/1990 |
| DE | 10338406 A1 | 3/2005 |

OTHER PUBLICATIONS

Blochwitz, J., et al., "Non-polymeric OLEDs with a doped amorphous hole transport layer and operating voltages down to 3.2 V to achieve 100 cd/m2". Synthetic Materials 127 (2002) 169-173.*

Mizokuro, Toshiko, et al., "Interface Structures between Polymer Substrates and Fluorescent Dye-Doped Polymer Layers Formed by Vaporization in Vacuum". Japanese Journal of Applied Physics, vol. 44 No. 1B, 2005, pp. 509-513.*

Aixtron SE; EP Application No. 08159270.1—EP Search Report and Written Opinion; Feb. 1, 2012; 20 pages.

* cited by examiner

*Primary Examiner* — Bret Chen

(74) *Attorney, Agent, or Firm* — Tarek N. Fahmi, APC

(57) ABSTRACT

In a method for producing especially doped layers for electronic, luminescent or photovoltaic components, especially OLEDs, one or more liquid or solid starting materials are evaporated in a source (11, 12, 13, 14) or are admixed as aerosol to a carrier gas and transported in this form to a deposition chamber (1) where they condense on a substrate (5), especially as a result of a temperature gradient, forming a doped matrix. In order to improve the doping of electronic, luminescent or photovoltaic layers, it is proposed that the doping occurs by modification of a starting material during its transport.

15 Claims, 1 Drawing Sheet

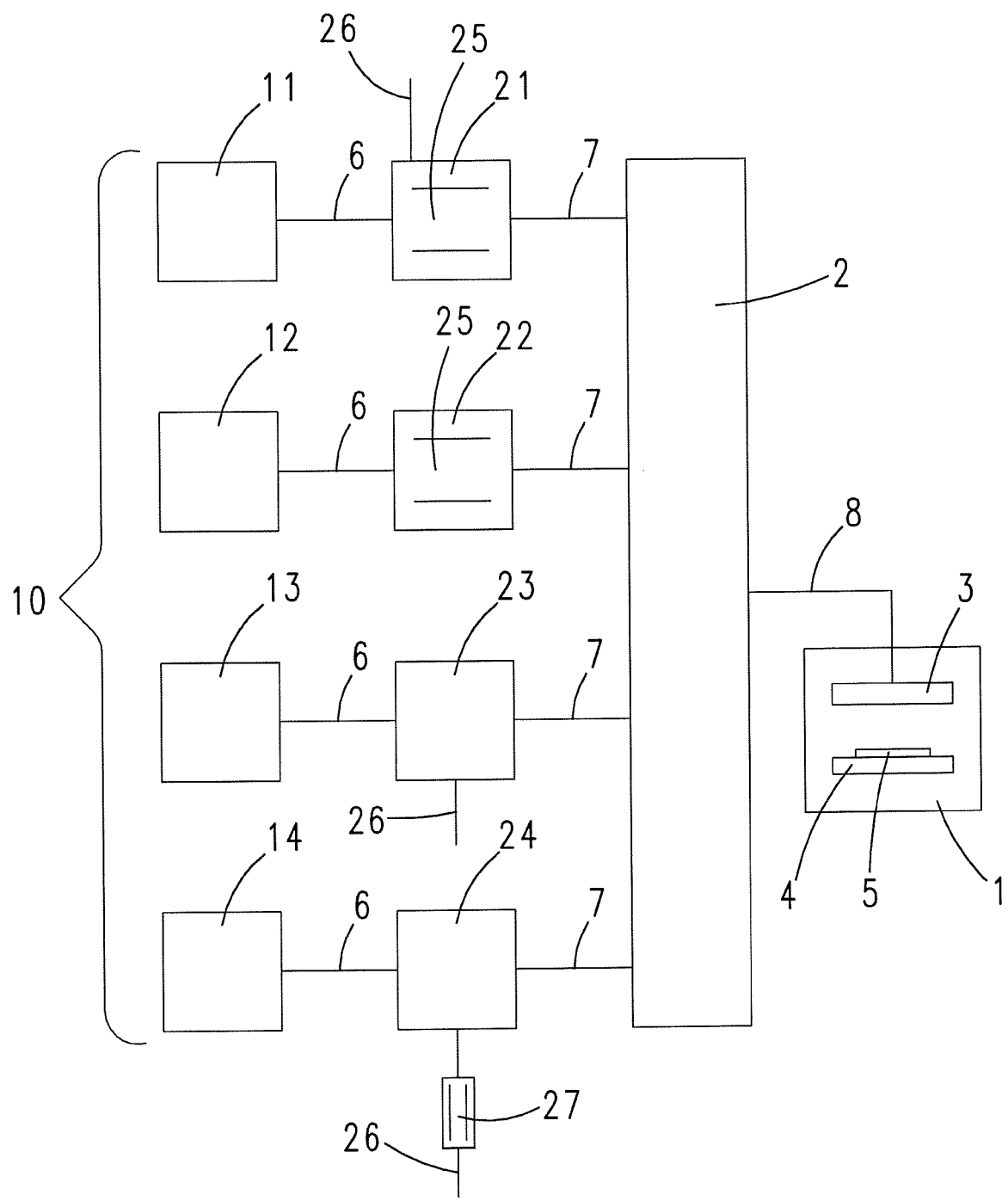

METHODS FOR DEPOSITING ESPECIALLY DOPED LAYERS BY MEANS OF OVPD OR THE LIKE

CROSS REFERENCES TO RELATED APPLICATIONS

This application is a NONPROVISIONAL of, claims priority to and incorporates by reference German Application No.: 10 2007 030 499.6 filed Jun. 30, 2007.

The invention relates to a method for producing especially doped layers for electronic, luminescent or photovoltaic components, especially OLEDs, according to which one or more liquid or solid starting materials evaporate in a source or are admixed as aerosol to a carrier gas and transported in this form to a deposition chamber where they condense, especially as a result of a temperature gradient, on a substrate, forming a preferably doped matrix.

The invention also relates to a device for performing the method, comprising the sources and the gas supply lines connecting the sources to the deposition chamber as well as a susceptor for taking up the substrate, which is disposed in the deposition chamber.

It is known in the art to produce, by means of organic starting materials which are present in the form of salts or small molecules, electronic, luminescent or photovoltaic components. These starting materials are transported by way of a carrier gas to a deposition chamber, where they condense forming layers on one or more substrates which are arranged on a susceptor. Sheets of glass are generally used as substrates. The susceptor is cooled so that the starting materials are transported against a negative temperature gradient.

A so-called OVPD (organic vapor phase deposition) process is specified in U.S. Pat. No. 5,554,220 and in the publication of S. R. Forrest et al. "Intense Second Harmonic Generation and Long-Range Structural Ordering in Thin Films of an Organic Salt Grown by Organic Vapor Phase Deposition," 68 Appl. Phys. Lett. 1326 (1996). The process is also specified in P. E. Burrows et al., "Organic Vapor Phase Deposition: a New Method for the Growth of Organic Thin Films with Large Optical Non-linearities," 156 Crystal Growth 91 (1995). Both citations, as well as the content of U.S. Pat. No. 5,554,220, are fully incorporated into the disclosure content of this patent application.

Furthermore, so-called OLEDs (organic light-emitting devices) are also produced by means of a thermal vacuum process VTE (vacuum thermal evaporation).

In the OVPD process, the starting materials, which are generally liquid or solid, are converted in so-called sources, by evaporation for example, into a gaseous form and then transported, preferably using a carrier gas, through gas lines into a deposition chamber. There is a gas inlet element for distributing and regulating the gas inflow in a deposition chamber in which the above-mentioned substrate lies. The light-emitting diodes (OLEDs), which are produced from these layers, generate light when current flows through. The flow of current occurs through electron conduction or hole conduction, where the current density not only depends on the hole concentration or the electron concentration, it also depends on their mobility. At the present time it is possible to produce OLEDs with 20 lm/W efficiency. In order to improve the efficiency, it is necessary to increase conductivity. To this aim, the deposited layers are electrically doped. It is also known in the art to produce stacked OLEDs by depositing different or identical OLED stacks with doped intermediate layers one on top of the other. In addition to light-emitting diodes, solar cells are also produced with the specified method. These photovoltaic components also require high conductivity.

In addition to electric doping, the layers can also be optically doped.

The deposition of the layer and thus also the doping and especially the incorporation of the dopant into the layer must take place at temperatures clearly below 200° C., because the starting materials which are used are highly temperature-unstable. Therefore, a requirement for the process is the availability of easy-to-handle starting materials, and especially an easy-to-handle dopant which can also be incorporated into the layer matrix at temperatures below 200° C., and especially at room temperature, and cause doping. Problems inherent in the incorporation of a dopant whose concentration is at least two orders of magnitude lower than the matrix concentration are specified in "Novel dopants for n-type doping of electron transport materials: cationic dyes and their bases," dissertation, Dipl.-Chem. [graduate chemist] Fenghong Li, January 2005, TU Dresden, and Yasunori Kijima, Nobutoshi Asai and Shin-ichiro Tamura, "A Blue Organic Light Emitting Diode," Jpn. J. Appl. Phys., vol. 38 (1999) 5274-5277, Part 1, No. 9A, 1999.

Unlike inorganic semiconductors, where states can be introduced into the band gap by specific doping, the charge carriers of organic layers must be located on an organic molecule. If a dopant is used in addition to starting materials which form the matrix material a chemical reaction (REDOX) between dopant and matrix material is necessary. This chemical reaction changes the organic molecule itself and generates new statuses/bonding conditions there. Due to the instability of the used molecules, the latter must take place below 200° C. and especially at room temperature.

DE 10338406 A1 specifies a method for doping organic semiconductor materials with elevated charge carrier density. Doping occurs by incorporation of a neutral organic compound into the matrix. The organic compound is present in hydrated form in this case.

It is incorporated directly into the organic semiconductor material. These are non-ionic molecules. Therefore, they are substantially fully sublimated. The uncharged organic compound is converted into a cation or a radical by splitting off hydrogen. Consequently, n-type doping can occur through the transfer of an electron from the radical to the semiconductor material, or p-type doping can occur when the cation takes up an electron from the semiconductor material.

DD 279032 A1 specifies a method for producing organic semiconductor layers. In a vacuum apparatus, thin layers are deposited on substrates. To this aim, a solid stoichiometric 1:1 donor complex with an acceptor and a solid acceptor are mixed at a predefined, non-integer ratio. The evaporated materials are deposited as a layer on the substrate.

U.S. Pat. No. 7,201,942 B2 specifies a device and a method for performing conventional OVPDs. Above a process chamber a plurality of liquid sources containing starting materials is disposed, which are introduced into the process chamber during the gas phase transport.

U.S. Pat. No. 6,207,238 B1 specifies the deposition of a polymer layer where the polymers are pretreated by a plasma in a high-vacuum process.

The object of the invention is to provide measures for improving the doping of electronic, luminescent or photovoltaic layers.

The object is achieved by the invention which is specified in the claims. Each claim represents an independent achievement of the object, and each claim can be combined with any other claim.

First, the method is substantially improved in such a way that the dopant or doping is obtained by modification of a starting material during its transport. Unlike patent DE 10338406 A1, the modification does not occur in the layer which has already been deposited, but away from the substrate in the gas phase. The modification spatially occurs between the source and the substrate in a gas phase, which means after evaporation in the gas phase. A neutral starting material, which without modification would not lead to doping, is modified, in terms of time, during the gas phase transport, which means in the gaseous state of the starting material and in the presence of a carrier gas.

The modification of the starting material can take place in a modification chamber which is disposed downstream of the source and upstream of the deposition chamber. The modification is a change of the starting material. The starting material can be changed chemically or physically. The modification may be a conversion of materials. For example, the starting material can be broken down into several products. The modification can be either an analysis or a synthesis. The latter is realized, for example, by the reaction of the starting material with a reaction partner. The starting material can react chemically with a reaction partner. Doping can be achieved by suitable chemical conversion of a starting material so that the layer, which is formed with this starting material, receives a higher electrical conductivity or another optical property. However, it is also possible that only a catalytic reaction takes place in the modification chamber. This can also be initiated through the supply of energy. Alternatively, or in combination with the above-described conversion of materials, the modification can also be caused merely by supplying energy. Energy can be supplied to the starting material by way of a plasma. It is also possible, however, to add energy to the starting material by means of a high-frequency generator. Using heat and a heater which generates the heat is another possibility. According to this alternative, the doping of the layer is caused by also modifying a starting material so as to increase the electron density or the hole density in the deposited layer, or to change the optical properties of the deposited layer. This can only involve energetic excitation. According to an alternative of the invention, a starting material forming the dopant, i.e. a precursor of the dopant, is modified. The precursor of the dopant itself cannot be incorporated into the matrix and increase conductivity. Instead, the precursor of the starting material must first be modified in the manner described above to produce a dopant which can be incorporated into the matrix. In this case, the dopant, which is produced by modification of a starting material, is mixed with one or more other starting materials forming the matrix in the modification chamber or in a mixing chamber which is disposed downstream of the modification chamber. In the alternative, in which the dopant is produced by modification of a starting material, the starting material, without modification, would form a non-conducting or poorly conducting layer in the layer. It obtains the quality of a dopant as a result of the modification. When this modified starting material is incorporated into the matrix, the electrical conductivity increases. The modification in this case can also occur through energy supply, synthesis or analysis. The modification can produce ions or neutral radicals. These ions or neutral radicals can develop a dopant function. They are introduced into the process chamber via a gas stream at a total pressure of over 0.1 mbar, especially over 1 mbar. The kinetic energy of the ions produced by the modification can be influenced with electric filters. The electric filters are preferably associated with a modification chamber. Possible matrix-forming starting materials are $alq_3$, $\alpha$-NPD, CuPC or $C_{60}$.

Especially $C_{60}$ can be used as a precursor of the dopant. For the modification of a starting material CO, $H_2$ in combination with a plasma, TMGa, $CH_4$ in combination with a plasma or $NH_3$ can be used for producing an n-conducting dopant. For producing a p-conducting dopant $O_3$, $N_2O$ together with a plasma, $O_2$ together with a plasma, $NO_x$, $SF_6$ together with a plasma, $CF_4$ together with a plasma, or any halogen $F_2$, $Cl_2$, $Br_2$, $I_2$, etc.) can be used.

The invention also relates to a method according to which the modification chamber functions as a "crack chamber." Under this alternative, only one starting material is broken down in the modification chamber. This can involve a starting material forming the matrix or a starting material constituting the doping or dopant as a result of modification. In the former case, the layer growth is interrupted by the temporary breakdown of the starting material. The breakdown products of the broken down starting material are unable to condense on the substrate and form a layer. Only the starting material in non-broken down state is able to do this. As soon as the breakdown of the starting material, which may occur by way of a plasma for example, stops, the layer growth continues. This provides a virtual run-vent system. The incorporation of the dopant can be similarly started and stopped. In this case, either the dopant is formed by using plasma or, by using plasma, a precursor of the dopant or the dopant itself is broken down in such a way that the dopant is not incorporated. Possible carrier gases are the known carrier gases, such as hydrogen nitrogen, or a suitable noble gas/inert gas. The method can be carried out at a total pressure of 1 mbar. The method can be carried out in a device, which is a known OVPD reactor having one or more sources as well as gas lines between the sources and a deposition chamber. According to the invention, this OVPD reactor is further developed by providing one or more modification chambers downstream of the one or more sources and upstream of the deposition chamber. In this modification chamber, a starting material can be modified by supplying energy and/or reaction gas. The modification chamber can comprise a plasma generator in which a DC voltage plasma or an AC voltage plasma is generated. Moreover, the modification chamber can comprise a high-frequency generator for building up an RF field with which the starting material can be modified. The modification chamber can also comprise a gas inlet for a reaction gas or a heater. A mixing chamber can be provided between the one or more modification chambers and the deposition chamber, where gas lines of a plurality of sources lead into the mixing chamber. For example, in one source a precursor of the dopant can be provided as the starting material. This starting material is taken via a carrier gas stream into the modification chamber. In this modification chamber the precursor of the dopant is modified into a dopant which is then carried with the gas stream into the mixing chamber. According to this alternative, a starting material forming a matrix can be provided in at least one other source. This starting material can be taken to the mixing chamber directly or also flowing through a modification chamber. Dopant and matrix-forming starting materials are homogenized in the mixing chamber where a gas phase reaction can already take place. The ratio of concentrations is selected such that the concentration of the dopant in the gas phase is approximately 100 times lower than that of the matrix-forming starting material. The gas mixture is led into the deposition chamber and condenses on the substrate which can be disposed on a cooled susceptor.

The starting materials are provided in accordance with the state of the art, specifically, especially by forming aerosols or by evaporation of a solid or a liquid. According to a further development of the invention, a reaction gas is supplied into the modification chamber as starting material. The modification chamber may be preceded by a plasma cell, in which the reaction gas can be treated with a plasma. The plasma can be used to activate the reaction gas.

FIG. 1 shows an exemplary embodiment of the invention. Reference number 10 refers to a source arrangement which, in the exemplary embodiment, consists of a total of four sources 11, 12, 13, 14. According to the invention, however, only one source 11 needs to be provided. This single source or the four sources 11, 12, 13, 14 in the exemplary embodiment are each connected via gas lines 6 to a modification chamber 21, 22, 23, 24 which is individually associated with the respective source 11, 12, 13, 14. Each of the modification chambers 21, 22, 23, 24 is connected to a mixing chamber 2 via the gas line identified by reference number 7. Alternatively, one or more sources 11, 12, 13, 14 can be directly connected to the mixing chamber 2 without intermediate modification chamber.

Downstream of the mixing chamber is a deposition chamber 1 which is connected to the mixing chamber 2 via the gas line 8. The deposition chamber 1 comprises a gas inlet system 3, which is supplied by the gas line 8. Below the gas inlet element 3 is a deposition chamber whose bottom is formed by a water-cooled susceptor 4. On the susceptor 4 lies a substrate 5, for example in the form of a glass sheet, which is to be coated with an electronic, light-emitting or photovoltaic layer of organic molecules. The total pressure in the process chamber is greater than 0.1 mbar and preferably greater than 1 mbar. It can also be greater than 10 mbar so that the presence of the carrier gas can develop a kinetic effect.

The organic molecules form solid, liquid or gaseous starting materials which are stored in the sources 11, 12, 13, 14 where they are either converted to the gas phase by evaporation or transformed by means of injection nozzles into aerosols, which can be transported via a carrier gas stream.

One of the sources 11, 12, 13, 14 comprises a material forming the layer, which was previously referred to as matrix-forming starting material.

It is also possible that one of the sources 11, 12, 13, 14 comprises a starting material, which is a precursor of a dopant.

The modification chambers 21, 22, 23, 24 comprise devices with which the starting material flowing through these modification chambers 21, 22, 23, 24 can be modified. The modification can be merely physical excitation, but it can also be a chemical reaction, for example an analysis or a synthesis. If the chemical reaction is a synthesis, another reaction gas can be introduced through a reaction gas supply line 26 into the modification chamber 21, 24. In this case, a plasma cell 27 can also be provided for exciting the reaction gas flowing through the reaction gas supply line 26 prior to entering the modification chamber.

The modification inside the modification chamber 21, 22 can take place by way of a plasma. To this aim, a plasma generator 25 is provided in the modification chamber 21, 22 which generates a DC voltage plasma or an AC voltage plasma. Physical excitations or chemical transformations/breakdowns of the molecules can be performed with this plasma. It is also possible to generate an RF field inside a modification chamber 23 in order to excite or chemically transform the starting materials. Finally, a heater is also provided for supplying energy for the modification.

$CO$, $H_2$, $TMGa$, $CH_4$ or $NH_3$ can be carried through the reaction gas line 26 as reaction gas. $H_2$ and $CH_4$ are broken down in the modification chamber 21 by way of the plasma generator 25. However, such a breakdown can also be performed before the modification chamber 24 with the plasma cell 27. The breakdown produces ions or radicals, for example elemental hydrogen, elemental nitrogen, or the like. These radicals can be incorporated into the matrix so as to be n-type doping. This involves reducing gases.

Alternatively, oxidizing gases, such as $O_3$, $N_2O$, $O_2$, $NO_x$, $SF_6$, $CF_4$, or halogens, such as $F_2$, $Cl_2$, $Br_2$ or $I_2$ can also be used. Again, the reaction gases can be broken down with a plasma into radicals or ions. If the breakdown product is an ion, the modification chambers 21, 22, 24 can also comprise electrostatic filters for influencing the kinetic energy of these ions.

Other possible starting materials for p-type doping or n-type doping are all other chemical compounds which are known to be dopants or precursors of dopants.

Finally, other possibilities are the matrix-forming starting materials, such as $alq_3$ or $\alpha$-NPD. The latter are transformed by the modification in such a way that they receive other electronic or optical properties.

However, with the device illustrated in FIG. 1 it is also possible to use the modification chambers 21, 22, 23, 24 as "cracker cells." With an appropriately efficient plasma the matrix-forming starting materials can be broken down. The breakdown products are then unable to condense on the substrate and form layers. They flow through the deposition chamber 1 without depositing. The plasma must be deactivated before these starting materials can pass unaffected through the "cracker cells" and then condense in the deposition chamber 1 on the substrate 5 and form a layer. Therefore, with the device shown in FIG. 1, it is possible to realize a virtual run-vent system.

All disclosed features are relevant (separately) to the invention. The disclosure content of the pertaining/enclosed priority documents (copy of the advance notification) is hereby also fully incorporated into the disclosure of the patent, also for purposes of including features of these documents into claims of this application.

The invention claimed is:

1. A method for producing doped layers for electronic, luminescent or photovoltaic components, the method comprising:
    evaporating, or admixing as an aerosol to a carrier gas, one or more liquid or solid starting materials in a source (11, 12, 13, 14) to produce a gaseous form of the one or more starting materials;
    transporting, in the gaseous form, the one or more starting materials from the source to a deposition chamber (1);
    during transport, while said first one of the one or more staring materials is in the gaseous form and is spatially located between the source and the deposition chamber, modifying the first one of the one or more starting materials to produce a dopant; and
    condensing, within the deposition chamber and as a result of a temperature gradient, the one or more staring materials on a substrate (5), thereby forming a doped matrix on the substrate,
    wherein the first one of the one or more starting materials is characterized in that without the modification, the first one of the one or more starting materials does not have a doping effect on the matrix.

2. The method according to claim 1, further characterized in that modification of the first one of the one or more starting materials occurs away from the substrate (5) in a presence of the carrier gas, and takes place in a modification chamber (21, 22, 23, 24) which is disposed downstream of the source (11, 12, 13, 14) and upstream of the deposition chamber (1).

3. The method according to claim 2, further characterized in that the modification is a molecular change.

4. The method according to claim 2, further characterized in that energy is supplied to the first one of the one or more starting materials by way of a plasma, RF excitation or by heat.

5. The method according to claim 4, further characterized in that the plasma is generated by a DC voltage plasma generator or an AC voltage plasma generator.

6. The method according to claim 2, further characterized in that the first one of the one or more starting materials comprises a precursor of the dopant and is converted into the dopant in the modification chamber (21, 22, 23, 24) which is disposed upstream of the deposition chamber (1).

7. The method according to claim 1, further characterized in that modification of the first one of the one or more starting materials takes place prior to its mixing with others of the one or more starting materials.

8. The method according to claim 1, characterized in that a kinetic energy of ions generated by the modification is influenced by electrostatic fields.

9. The method according to claim 1, further characterized in that the dopant formed by the modification comprises neutral radicals.

10. The method according to claim 1, further characterized in that alq$_3$, α-NPD, CuPC and/or C$_{60}$ is used as one of the one or more starting materials.

11. The method according to claim 1, further characterized in that O$_3$, N$_2$O, O$_2$, NO$_X$, SF$_6$, CF$_4$ and/or a halogen is used for the modification of the first one of the one or more starting materials.

12. The method according to claim 1, further characterized by chemically reacting the first one of the one or more starting materials with a reaction partner prior to the dopant entering the deposition chamber (1).

13. A method for producing layers for electronic, luminescent or photovoltaic components, in which one or more liquid or solid starting materials evaporate in a source (11, 12, 13, 14) or are admixed as an aerosol to a carrier gas and are transported in this form into a deposition chamber (1), where they condense, as a result of a temperature gradient, on a substrate forming a matrix, the method characterized in that a growth of one or more of the layers is influenced by a breakdown of one of the starting materials prior to entering the deposition chamber (1), said breakdown resulting from application of a plasma to the starting materials prior to their admission into the deposition chamber.

14. The method according to claim 13, further characterized in that one of the starting materials forming the matrix is broken down.

15. The method according to claim 13, further characterized in that one of the starting materials representing or forming a dopant is broken down.

* * * * *